US012668875B2

(12) United States Patent
Parish et al.

(10) Patent No.: US 12,668,875 B2
(45) Date of Patent: Jun. 30, 2026

(54) ATOMIC LAYER DEPOSITION METHOD OF METAL (II), (0), OR (IV) CONTAINING FILM LAYER

(71) Applicant: THE UNIVERSITY OF BATH, Bath (GB)

(72) Inventors: James D. Parish, Bath (GB); Andrew L. Johnson, Bath (GB)

(73) Assignee: THE UNIVERSITY OF BATH, Bath (GB)

(*) Notice: Subject to any disclaimer, the term of this patent is extended or adjusted under 35 U.S.C. 154(b) by 200 days.

(21) Appl. No.: 17/764,501

(22) PCT Filed: Sep. 20, 2020

(86) PCT No.: PCT/GB2020/052345
§ 371 (c)(1),
(2) Date: Mar. 28, 2022

(87) PCT Pub. No.: WO2021/058986
PCT Pub. Date: Apr. 1, 2021

(65) Prior Publication Data
US 2022/0356576 A1 Nov. 10, 2022

(30) Foreign Application Priority Data
Sep. 27, 2019 (GB) ..................................... 1913951

(51) Int. Cl.
*C23C 16/455* (2006.01)
*C23C 16/18* (2006.01)

(52) U.S. Cl.
CPC ........ *C23C 16/45527* (2013.01); *C23C 16/18* (2013.01)

(58) Field of Classification Search
CPC .......................... C23C 16/45527; C23C 16/18
See application file for complete search history.

(56) References Cited

U.S. PATENT DOCUMENTS

2012/0171378 A1 7/2012 Xiao et al.

FOREIGN PATENT DOCUMENTS

EP 2532767 A1 12/2012
WO 2008057616 A 5/2008
(Continued)

OTHER PUBLICATIONS

Heo et al. "Low Temperature Atomic Layer Deposition of Tin Oxide" Chem. Mater. 2010, 22, 17, 4964-4973.*
(Continued)

*Primary Examiner* — Robert S Walters, Jr.
(74) *Attorney, Agent, or Firm* — Kolitch Romano Dascenzo Gates LLP

(57) ABSTRACT

An atomic layer deposition (ALD) method may include forming a chemisorbed, surface-bound metal-ligand species using a metal M (II) primary precursor of formula (I):

$$M(OCR^1R^2R^3)\ L \qquad (I)$$

In formula (I), M is Sn or Ge or Pb; L is a ligand displaying ALD reactivity for a secondary precursor; and $R^1$, $R^2$, and $R^3$ are each independently selected from: H or a linear or branched alkyl groups. At least one of $R^1$, $R^2$ and $R^3$ is a linear or branched alkyl group.

20 Claims, 6 Drawing Sheets

(56) References Cited

FOREIGN PATENT DOCUMENTS

| | | | |
|---|---|---|---|
| WO | 2011057114 | A2 | 5/2011 |
| WO | 2013118937 | A1 | 8/2013 |

OTHER PUBLICATIONS

Lee et al. "Atomic Layer Deposition of Metal Fluorides Using HF-Pyridine as the Fluorine Precursor" Chem Mater. 2016,28,2022-2032 (Year: 2016).*

Nykanen et al. "Growth of PbS Thin Films from Novel Precursors by Atomic Layer Epitaxy" J. Mater. Chem., 1994, 4(9), 1409-1412. (Year: 1994).*

Sbrockey et al. "Atomic layer deposition of PbTiO3 and PbZrxTi1—xO3 films using metal alkyl and alkylamide precursors" J. Vac. Sci. Technol. A 36, 031509 (2018) (Year: 2018).*

International Search Report and Written Opinion of the International Searching Authority from the European Patent Office, in PCT/GB2020/052345 dated Dec. 15, 2020, which is an international application corresponding to this U.S. application.

Hill, Michael S., et al.; "Aerosol-assisted CVD of SnO from Stannous Alkoxide Precursors"; obtained at https://researchportal.bath.ac.uk/en/publications/aerosol-assisted-cvd-of-sno-from-stannous-alkoxide-precursors; published Dec. 7, 2016.

* cited by examiner

ATOMIC LAYER DEPOSITION METHOD OF METAL (II), (0), OR (IV) CONTAINING FILM LAYER

TECHNICAL FIELD

The present disclosure relates to the use of M (II) containing primary precursors in the atomic layer deposition of M (0), (II) or (IV) containing film layers. The present disclosure also relates to a method of atomic layer deposition of M containing film layers using M (II) containing primary precursors. The present disclosure also relates to the use of the aforementioned precursors in the deposition of a MO or MO(x) containing film layer, for example SnO, which has the potential to be used as a p-type semiconducting layer in a number of electronic devices, such as p-type metal oxide semiconductor (PMOS) and Complementary Metal Oxide Semiconductor (CMOS) devices.

BACKGROUND

Atomic layer deposition (ALD) is a vapor deposition technique comprising the controlled introduction of two or more precursor entities, comprising a primary precursor and a secondary precursor, to a substrate. A schematic representation of the ALD process is shown in FIG. 1, with FIG. 1 showing ALD with purge stages and FIG. 1*b* showing spatial ALD. The primary precursor is usually a metal-containing precursor, and the secondary precursor is usually a simple molecule such as $H_2O$, $H_2S$, $NH_3$, or alternatively plasma/ozone. The precursors are introduced to the reaction chamber in a sequential fashion, with each introduction followed by a "purge" step, so as to avoid precursor mixing or by moving the substrate relative to the precursor flow.

The first cycle of the ALD process involves introducing a reactive primary metal-containing precursor into the processing chamber containing the substrate. The reactive primary precursor reacts with the surface functionality on the substrate, liberating a ligand species, and leaving a chemisorbed, surface-bound metal-ligand species. The layer of chemisorbed surface-bound metal-ligand species is usually <1 atomic monolayer in thickness as once all of the reactive surface sites on the substrate are taken, excess primary precursor will not decompose or react in the vapor phase. As a result, the primary precursor reacts with the surface of the substrate in a self-limiting manner. The excess primary precursor and any liberated ligand species are then removed from the processing chamber by the purging step or by moving the substrate to another station.

The second cycle of the ALD process involves introducing a secondary precursor that displays high reactivity towards the primary precursor. It is therefore important to ensure that the purge step etc. has efficiently removed all excess primary precursor from the processing chamber prior to introduction of the secondary precursor. If precursor inter-mixing were to occur, uncontrolled material deposition would result, in a non-surface limited fashion, in what would conventionally be referred to as "chemical vapor deposition (CVD)" growth. The secondary precursor reacts with the new surface-bound reactive sites (i.e. -Metal-Ligand sites) on the surface of the substrate. The reaction of the secondary precursor with the surface-bound reactive sites liberates the remaining ligand species and usually leaves a -Metal-OH surface (for processes in which a metal oxide is desired). The system is once again purged to remove any excess secondary precursor from the processing chamber. The time a surface is exposed to a precursor in referred to as a dose or pulse time. The time in between doses of precursor (i.e. the time taken to evacuate or purge the chamber) is referred to as a purge time. The dose-purge-dose-purge sequence of a binary ALD process constitutes an ALD cycle. This cycle can be repeated as many times as required in order to deposit a film having a predetermined thickness on the surface of the substrate.

US-A-2012/171378 and EP-A-2 532 767 disclose the synthesis of metal chalcogenides using chemical vapor deposition (CVD) process, atomic layer deposition (ALD) process, or wet solution processes using ligand exchange reactions of organosilyltellurium or organosilylselenium with a series of metal compounds.

WO-A-2013/118937 discloses a method for forming a zinc tin oxide thin film using zinc and tin precursors by means of chemical vapor deposition (CVD) or atomic layer deposition (ALD), and to a method for manufacturing a thin film transistor (TFT) element using the method.

WO-A-2008/057616 discloses antimony, germanium and tellurium precursors useful for CVD/ALD of corresponding metal-containing thin films and compositions including such precursors, methods of making such precursors, and films and microelectronic device products manufactured using such precursors, as well as corresponding manufacturing methods.

ALD enables films to be efficiently deposited in a highly conformal ABABAB fashion on the surface of a substrate through the sequential introduction of precursors into the processing chamber. ALD can therefore be used to provide uniform deposition of precursors onto the surface of a substrate without "infilling" of trenches or holes. The ALD method is highly controllable and can enable deposition of precursors onto a substrate with a linear relationship between the number of cycles and the resultant film thickness.

Despite significant interest, there has been limited success in the use of Sn (II) complexes as ALD precursors. It has been found that Sn (II) chemistry is challenging and to-date precursor development for most elements has focused on the formulation of monomeric metal complexes in the belief that it will aid volatility and reactivity. Conventionally, Sn (II) precursors comprise ligands with large steric bulk in order to reduce or avoid polymerization of Sn (II) complexes, though few examples of Sn (II) atomic layer deposition precursors exist. However, the presence of ligands with large steric bulk has also been found to reduce the reactivity of the primary Sn (II) precursor towards a secondary precursor. Secondary precursors for metal oxide materials typically include $H_2O$, $H_2O_2$, ozone or plasma. It is desirable for a number of commercial processes to use a primary precursor which displays reactivity towards $H_2O$, particularly for oxidatively sensitive materials such as SnO or SnO(X) (where $x<2$), where preservation of the +2 oxidation state of Sn is required. However, this requires the primary Sn (II) precursor to have high reactivity. It has also been found that the other common secondary precursors such as $H_2O_2$, ozone or plasma may undesirably result in the deposition of $SnO_2$ (n-type) on the surface of the substrate. As such, there is a need to identify Sn (II) precursors that are both volatile and reactive towards an oxygen source, whilst also resisting oxidation to the more thermodynamically stable Sn (IV) oxide.

It is also desirable to identify Sn (II) precursors which can be deposited via ALD onto a surface of a substrate to provide a crystalline film of SnO with the required electrical properties. Amorphous films of SnO have been found to exhibit poor conductivity and are therefore not always optimum for use within electronic devices.

SUMMARY

According to a first aspect of the present disclosure there is provided use of a metal (M) (II) containing primary precursor of formula (I):

$$M(OCR^1R^2R^3)\ L \tag{I}$$

wherein:

M is Sn or Ge or Pb;

L is a ligand displaying ALD reactivity for a secondary precursor;

$R^1$, $R^2$, and $R^3$ are each independently selected from: H or a linear or a branched alkyl group, and wherein at least one of $R^1$, $R^2$ and $R^3$ is a linear or branched alkyl group, or an adduct of a M (II) containing primary precursor of formula (I)

in the atomic layer deposition (ALD) of a M (II), M (0), or a M (IV) containing film layer on a substrate.

The M (II) containing primary precursor displays high reactivity to many commonly used secondary precursors.

L preferably displays good ALD reactivity for a secondary precursor

L may be a chelating or monodentate ligand. L is preferably selected from: an amide (such as for example an amide (as defined by M—N bonds) of formula $NR^4R^5$, in which each of $R^4$ and $R^5$ are independently selected from: H, a linear or a branched alkyl group, cycloalkyl group), alkoxide, aminoalcohol, aminoamide, alkoxyether, cyclopenadienyl (Cp), or Cp derivatives, or halide (such as for example chloride, iodide, bromide or fluoride).

Preferably, L is an amide or an alkoxide.

Alkoxide ligands include for example ligands of formula $(OCR^{1'}R^{2'}R^{3'})$, wherein $R^{1'}$, $R^{2'}$, and $R^{3'}$ are each independently selected from: H or a linear or a branched alkyl group, and wherein at least one of $R^{1'}$, $R^{2'}$ and $R^{3'}$ is a linear or branched alkyl group.

The M (II) containing primary precursor may comprise a homoleptic alkoxide systems, wherein L is an alkoxide ligand of formula $(OCR^{1'}R^{2'}R^{3'})$, in which $(OCR^{1'}R^{2'}R^{3'})$ is the same as the $(OCR^1R^2R^3)$ group.

The M (II) containing primary precursor may comprise a heteroleptic alkoxide systems, wherein L is an alkoxide ligand of formula $(OCR^{1'}R^{2'}R^{3'})$, in which $(OCR^{1'}R^{2'}R^{3'})$ is different to the $(OCR^1R^2R^3)$ group.

Preferably, the film layer is a M (II) containing film layer, for example a crystalline M (II) containing film.

In one embodiment, M is Sn.

The Sn containing film layer may be selected from: a Sn (II) oxide, an (SnO) film layer, a $SnO_2$ layer, a $SnO_2O_3$ layer, a SnS layer, a $SnS_2$ layer, a $Sn_2S_3$ layer, a $SnE_x$ layer where E is selected from chalcogenide or pnictogen and x is 1 or 2, or a $Sn_2E_3$ layer where E is selected from chalcogenide or pnictogen. The term "chalcogenide" is used herein to refer to group 16 elements of the periodic table. Preferably, the chalcogenide is selected from oxides, sulphides, selenides, and tellurides. Preferably, the Sn (II) containing film layer is Sn (II) oxide. The Sn (II) oxide thin may be a crystalline Sn (II) oxide film layer. The term "pnictogen" is used herein to refer to group 15 elements of the periodic table. Preferably, the pnictogen is nitrogen or phosphorus.

In one embodiment, M is Ge.

The Ge containing film layer may be selected from: a Ge (II) oxide (GeO) film layer, a $GeO_2$ layer, a GeS layer, a $GeS_2$ layer, a $GeE_x$ layer where E is selected from chalcogenide or pnictogen (preferably nitrogen or phosphorus) and x is 1 or 2, or a $Ge_2E_3$ layer where E is selected from chalcogenide or pnictogen. Preferably, the Ge (II) containing film layer is Ge (II) oxide. The Ge (II) oxide film layer may be a crystalline Ge (II) oxide film layer.

In one embodiment, M is Pb.

The Pb containing film layer may be selected from: a Pb (II) oxide (PbO) film layer, a $PbO_2$ layer, a PbS layer, a $PbS_2$ layer, a $PbE_x$ layer where E is selected from chalcogenide or pnictogen (preferably nitrogen or phosphorus) and x is 1 or 2, or a $Pb_2E_3$ layer where E is selected from chalcogenide or pnictogen. Preferably, the Pb (II) containing film layer is Pb (II) oxide. The Pb (II) oxide film layer may be a crystalline Pb (II) oxide film layer.

The M (II), M (0), or a M (IV) containing film layer is preferably of predetermined, uniform depth across a surface of a substrate. Preferably, the film layer is a M (II) containing film layer.

In one embodiment, the metal (M) containing film layer is a multicomponent metal (M) containing film layer comprising at least one additional metal (M'). For example, the at least one additional metal (M') is selected from one or more of: Ti, In, Ga, Zn, Cu, Sr, Ba, Mg, W, Pb, Se, S, Te, Bi, Fe, Ni, Co, Al, Si, Sb, K, Na, Ca, Sr, Ba, Li, V and La, or any combination thereof.

In one embodiment, the M (II) containing primary precursor may be used in the atomic layer deposition (ALD) of a metal (M) and F containing film layer, for example a Sn and F containing film layer.

The phrase "a linear or branched alkyl group" refers to straight linear chain and branched saturated hydrocarbon groups, generally having from 1 to 12 carbon atoms; suitably a $C_{1-6}$ alkyl; suitably a $C_{1-5}$ alkyl; more suitably a $C_{1-4}$ alkyl; more suitably a $C_{1-3}$ alkyl. Examples of alkyl groups include methyl, ethyl, n-propyl, i-propyl, n-butyl, s-butyl, i-butyl, t-butyl, pent-1-yl, pent-2-yl, pent-3-yl, methylbut-1-yl, 3-methylbut-2-yl, 2-methylbut-2-yl.

An adduct is formed from the M (II) containing primary precursor together with additional molecules. The adduct is preferably a neutral adduct. The volatility of the adduct may be improved compared to the volatility of the M (II) containing primary precursor. The adduct may ensure that the M (II) containing primary precursor is monomeric. The adduct preferably comprises pyridine or one or more chelating amines.

According to a second aspect of the present disclosure, there is provided an atomic layer deposition (ALD) method for forming a film layer of a metal (M) containing film layer, in which the film layer is a M (II), M (0), or a M (IV) containing film layer on a surface of a substrate, the method comprising:

heating a substrate in a processing chamber;

contacting a surface of the substrate with a M (II) primary precursor of formula (I):

$$M(OCR^1R^2R^3)\ L \tag{I}$$

wherein:

M is Sn or Ge or Pb;

L is a ligand displaying ALD reactivity for a secondary precursor;

$R^1$, $R^2$, and $R^3$ are each independently selected from: II or a linear or branched alkyl groups, and wherein at least one of $R^1$, $R^2$ and $R^3$ is a linear or branched alkyl group, or an adduct of a M (II) containing primary precursor of formula (I) to the processing chamber in a first dose stage for a predetermined first dose time;

either optionally purging the processing chamber in a first optional purge stage to remove remaining M (II) primary precursor, or optionally moving the substrate relative to the precursor source in a first optional movement stage;

contacting the surface of the substrate with a secondary precursor in a second dose stage for a predetermined second dose time; and either optionally subsequently purging the processing chamber in a second optional purge stage to remove the secondary precursor, or optionally moving the substrate relative to the precursor source in a second optional movement stage;

optionally repeating one or more of: the first dose stage, first optional purge stage, first optional movement stage, second dose stage and second optional purge stage, and second optional movement stage;

to produce a M (II), M (0), or a M (IV) containing film layer on the surface of the substrate.

Optionally moving the substrate relative to the precursor source may involve moving the substrate in the processing chamber or moving the precursor source(s) (e.g. precursor inlets) relative to the substrate or both. In spatial ALD, the precursor flows may be kept separated by a flow of inert gas that fulfils the puree function.

According to a third aspect of the present disclosure, there is provided an atomic layer deposition (ALD) method for forming a film layer of a metal (M) containing film layer, in which the film layer is a M (II), M (0), or a M (IV) containing film layer on a surface of a substrate, the method comprising:

heating a substrate in a processing chamber;

introducing a M (II) primary precursor of formula (I):

$$M(OCR^1R^2R^3)\ L \quad (I)$$

wherein:

L is a ligand displaying ALD reactivity for a secondary precursor; M is Sn or Ge or Pb;

$R^1$, $R^2$, and $R^3$ are each independently selected from: H or a linear or branched alkyl groups, and wherein at least one of $R^1$, $R^2$ and $R^3$ is a linear or branched alkyl group, or an adduct of a M (II) containing primary precursor of formula (I) to the processing chamber in a first dose stage for a predetermined first dose time;

subsequently purging the processing chamber in a first purge stage to remove remaining M (II) primary precursor or adduct;

introducing a secondary precursor to the processing chamber in a second dose stage for a predetermined second dose time; and subsequently purging the processing chamber in a second purge stage to remove the secondary precursor;

optionally repeating one or more of: the first dose stage, first purge stage, second dose stage and second purge stage;

to produce a M (II), M (0), or a M (IV) containing film layer on the surface of the substrate.

The method of the present disclosure comprises processes in which an atomic layer deposition (ALD) mechanism is the primary method of material deposition. The method of the present disclosure does not extend to other deposition techniques such as traditional Chemical Vapor Deposition (CVD) for which Sn (II) alkoxides have been known to be effective. During traditional Chemical Vapor Deposition (CVD) the precursors are thermally decomposed as disclosed in Hill et al, Dalton Trans., 2016, 45, 18252-18258. The method of the present disclosure requires the primary precursor to be delivered to the surface of the substrate without thermal decomposition of the primary precursor. The temperature of the processing chamber is preferably less than the thermal decomposition temperature of the primary precursor.

The term "atomic layer deposition (ALD)" is used herein to refer to any variant of ALD, including plasma-enhanced, thermal, spatial ALD and liquid injected ALD.

ALD methods rely on self-limited reactions of precursor molecules (A) with the substrate surface, with co-reagents (B) and precursor (A) delivered in separate pulses, in an ABAB fashion to the substrate. Each pulse of precursor or co-reagent is separated by a "purge" of inert gas and/or vacuum to ensure that the bulk of the precursor and the co-reagent do not mix. This purge step prevents any reaction between the precursor and the co-reagent in the gas phase. In contrast, traditional CVD processes rely on precursor decomposition, thermally or otherwise induced, and by the mixing of precursor molecules and reactants such as oxygen.

Preferably, the ALD method of the present disclosure enables the M (II), M (0), or a M (IV) containing film layer to be deposited at low temperatures. In particular, the processing chamber is preferably heated to a temperature which is lower than the thermal decomposition point of the M (II) containing primary precursor of formula (I) to avoid uncontrolled deposition (i.e. CVD). It is to be understood that the maximum operating temperature of the processing chamber during ALD (i.e. a maximum operating temperature of less than the thermal decomposition point of the M (II) containing primary precursor, will vary depending on the type of M (II) containing primary precursor which is being used to form the M (II), M (0), or a M (IV) containing film layer on the substrate.

The processing chamber may be heated to any suitable temperature. Preferably, the processing chamber is heated to a temperature within the range of from 70° C. to 250° C., preferably from 90° C. to 250° C., more preferably from 120° C. to 250° C., for example from 150° C. to 210° C.

It has been found that crystalline M (II), M (0), or a M (IV) containing film layers may be deposited when the processing chamber is heated to a temperature within the range of between 90° C. and 250° C., more preferably between 120° C. and 250° C., for example between 150° C. and 210° C. When the temperature of the processing chamber is outside of this temperature range, the deposited M (II), M (0), or a M (IV) containing film layer may be amorphous.

In one embodiment, $R^1$, $R^2$, and $R^3$ of the M (II) containing primary precursor of formula (I) or adduct are each independently selected from: H or a linear or a branched $C_{1-4}$ alkyl group, wherein at least one of $R^1$, $R^2$ and $R^3$ is a linear or a branched $C_{1-4}$ alkyl group.

In one embodiment, $R^1$, $R^2$, and $R^3$ of the M (II) containing primary precursor of formula (I) or adduct are each independently selected from: H or a linear or a branched $C_{1-3}$ alkyl group, wherein at least one of $R^1$, $R^2$ and $R^3$ is a linear or a branched $C_{1-3}$ alkyl group.

In one embodiment, $R^1$, $R^2$, and $R^3$ of the M (II) containing primary precursor of formula (I) or adduct are each independently selected from: H or a linear or a branched $C_{1-2}$ alkyl group, wherein at least one of $R^1$, $R^2$ and $R^3$ is a linear or a branched $C_{1-2}$ alkyl group.

In one embodiment, the M (II) containing primary precursor is selected from:

$M(O^iPr)_2$, $M(O^tBu)_2$, $M(OC(H)MeEt)_2$, $M(OC(H)Me^iPr)_2$, and $M(OCMe_2Et)_2$.

In one embodiment, the M (II) containing primary precursor is selected from:

$Sn(O^iPr)_2$, $Sn(O^tBu)_2$, $Sn(OC(H)MeEt)_2$, $Sn(OC(H)Me^iPr)_2$, and $Sn(OCMe_2Et)_2$.

In one embodiment, the M (II) containing primary precursor is selected from: $M(O^tBu)_2$, $M(OC(H)MeEt)_2$ and $M(OCMe_2Et)_2$.

In one embodiment, the M (II) containing primary precursor is selected from the novel precursors:

$Sn(O^tBu)_2$, $Sn(OC(H)MeEt)_2$, and $Sn(OCMe_2Et)_2$

The M (II) containing precursors and adducts have been found to have desirable volatilities and stabilities for ALD. In one embodiment, the M (II) oxide precursors and adducts have a volatility at standard pressure of at least 25 μg $min^{-1}$ $cm^{-1}$, preferably at least 30 μg $min^{-1}$ $cm^{-1}$, more preferably at least 40 μg $min^{-1}$ $cm^{-1}$, for example at least 60 μg $min^{-1}$ $cm^{-1}$. The volatilities are measured by isothermal thermogravimetric analysis and samples are held at an elevated temperature (such as for example at 70° C. or 100° C.) for two hours, and the mass change is measured.

Preferably, the pressure within the processing chamber is within the range of from 0.1 mbar to 50 mbar. In the method (especially in spatial ALD) deposition may occur at around atmospheric pressure.

The ALD may be carried out within the processing chamber under a flow of inert gas, such as argon or nitrogen.

The M (II) containing primary precursor or adduct may be introduced at any suitable flow rate into the processing chamber. The M (II) containing primary precursor or adduct may be introduced within a flow of inert gas, such as argon or nitrogen. The M (II) containing primary precursor or adduct may be introduced into the processing chamber via their own volatility. The M (II) containing primary precursor or adduct may, if using liquid injected ALD, be delivered to the processing chamber via an aerosolized or sprayed solution in an inert solvent.

The M (II) containing primary precursor or adduct is preferably introduced to the processing chamber over any suitable time or dose period to enable maximum adsorption density of the precursor onto the substrate, i.e. once the deposition of the M (II) containing primary precursor onto the substrate has been saturated and no other reactive sites remain on the substrate and/or depending on the desired film properties and film growth. For example, the residency time of the M (II) containing primary precursor or adduct within the processing chamber may be at least 50 milliseconds, preferably at least 500 milliseconds, preferably at least 1 second, preferably at least 2 seconds, more preferably at least 5 seconds. It is to be understood that the deposition may be achieved using a short residency time of the precursor or adduct with an increased number of deposition cycles.

The method comprises a first purging step to remove any excess M (II) containing precursor or adduct from within the chamber. Purging of the processing chamber usually occurs once maximum adsorption density of the M (II) containing primary precursor has been achieved. The duration of the first purging step may be selected or tailored in order to afford predetermined film growth due to precursor desorption from the substrate. For example, the first purging step may be a period of at least 50 milliseconds, preferably at least 500 milliseconds, preferably at least 1 second, preferably at least 2 second, preferably at least 5 seconds, more preferably at least 10 seconds. It is to be understood that the duration of the first purging step may be shorter when less precursor or adduct has been introduced into the chamber. The ratio of the duration of the first purging step to residency time of the M (II) containing precursor or adduct within the processing chamber is preferably at least 1.5:1, more preferably at least 2:1.

The method comprises introducing a secondary precursor into the processing chamber after the first purging step. The secondary precursor may be any suitable precursor exhibiting high reactivity to the M (II) containing primary precursor, for example the secondary precursor is preferably selected from: $H_2O$, $H_2O_2$, plasma (for example $O_2$, $H_2$, $NH_3$, Ar, $N_2$), carboxylic acids, nitrous oxide, hydrogen, oxygen, ozone or ammonia.

In one embodiment, the atomic layer deposition (ALD) method of the present disclosure forms a M (II) oxide film layer on a surface of a substrate. The secondary precursor is preferably selected from: $H_2O$, nitrous oxide or carboxylic acids. Preferably, the secondary precursor is $H_2O$.

In one embodiment, the atomic layer deposition (ALD) method of the present disclosure forms a M sulfide film layer on a surface of a substrate. The secondary precursor is preferably hydrogen sulfide or any other suitable sulfurizing co-reagent.

In one embodiment, the atomic layer deposition (ALD) method of the present disclosure forms a M nitride, M phosphide or phosphate, M selenide and/or M telluride films. The secondary precursor is preferably selected from: nitrogen, phosphorus, selenium or tellurium containing precursors or plasmas such as $NH_3$, $PR_3$, $H_2Se$, $E(NR_2)$ (where E=Se, Te and R=H/alkyl/aryl or $SiR'_3$ where R, R' are independently selected from H, alkyl or aryl. A number of phosphate ALD precursors are known including $OP(OR)_3$ and $HOP(O)(OR)_2$, and similar processes exist for metal phosphide containing film layers utilizing phosphorus containing precursors such as $PR_3$ and $PH_3$.

The secondary precursor is preferably introduced to the processing chamber over any suitable time or dose period to enable maximum reaction between the secondary precursor and the surface-bound M (II) containing species, for example M (II) oxide containing species, on the surface of the substrate. The residency time of the secondary precursor within the processing chamber may vary depending on the particular growth properties of the film and film properties. For example, the residency time of the secondary precursor within the processing chamber over a period of at least 50 milliseconds, preferably at least 500 milliseconds, preferably at least 1 second, preferably at least 2 seconds, more preferably at least 5 seconds. In one embodiment, the duration of the residency time of the secondary precursor is equal to the residency time of the M (II) containing primary precursor within the processing chamber. It is to be understood that maximum reaction between the secondary precursor and the surface-bound M (II) containing species may be achieved using a short residency time of the secondary precursor with an increased number of reaction cycles.

The method preferably further comprises a subsequent second purging step to remove excess secondary precursor from within the chamber. Purging of the processing chamber usually occurs once maximum reaction between the secondary precursor and the surface-bound M (II) containing species, for example M (II) oxide containing species, on the surface of the substrate has been achieved. For example, the second purging step may be a period of at least 50 milliseconds, preferably at least 500 milliseconds, preferably at least 1 second, preferably at least 2 seconds, preferably at least 5 seconds, more preferably at least 10 seconds. It is to be understood that the duration of the second purging step may be shorter when less secondary precursor has been introduced into the chamber. The ratio of the duration of the second purging step to residency time of the second precursor within the processing chamber is preferably at least 1.5:1, more preferably at least 2:1. The ratio of the duration of the second purging step to the duration of the first purging step is preferably 1:1.

One example of the method of the present disclosure comprises heating the processing chamber to an operating temperature in the range of from 90° C. to 250° C. with a gas flow rate of 300 sccm (standard centimeters cubed per minute). The residency time of the M (II) containing primary precursor, for example M (II) oxide primary precursor within the processing chamber is 5 seconds. The duration of the first purging step using vacuum/nitrogen is 10 seconds. The residency time of the secondary precursor, for example water, is 5 seconds. The duration of the second purging step using vacuum/nitrogen is 10 seconds.

Those skilled in the art will appreciate that though specific examples and conceptions of the application of M (II) containing primary precursors and their utility in ALD have been provided herein, these disclosures may be readily modified and utilized as a basis for undertaking the same purposes as the present disclosure. Those skilled in the art will additionally appreciate that these modifications do not depart from the spirit and scope of the present disclosure.

Embodiments of the present disclosure will be described in more detail with reference to the accompanying Figures:

BRIEF DESCRIPTION OF FIGURES

(FIG. 6*a*) and 210° C. (FIG. 6*b*)

EXAMPLE 1

Figure 1A:
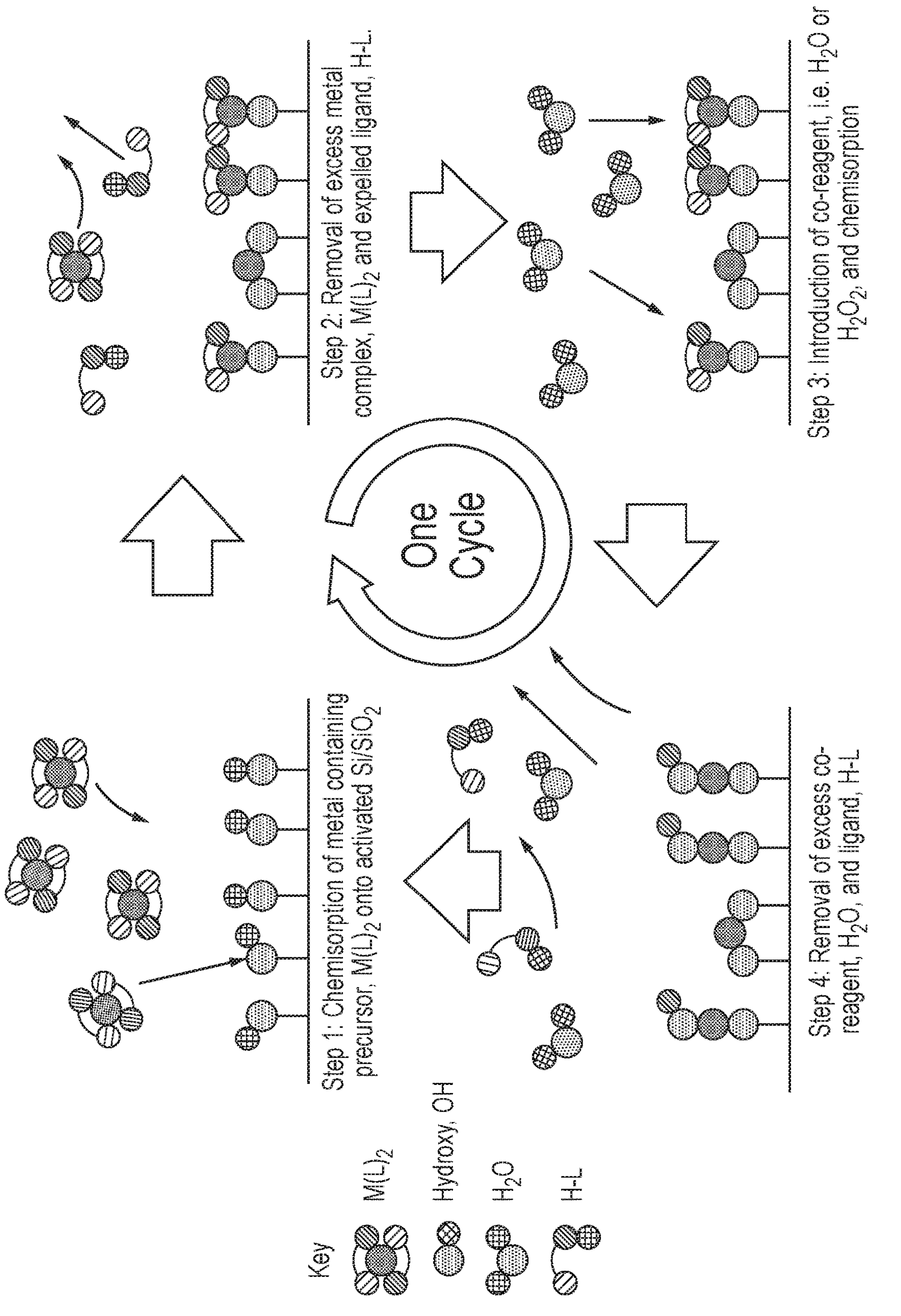
FIG. 1*a* is a schematic illustration of the atomic layer deposition (ALD) process.
Figure 1B:
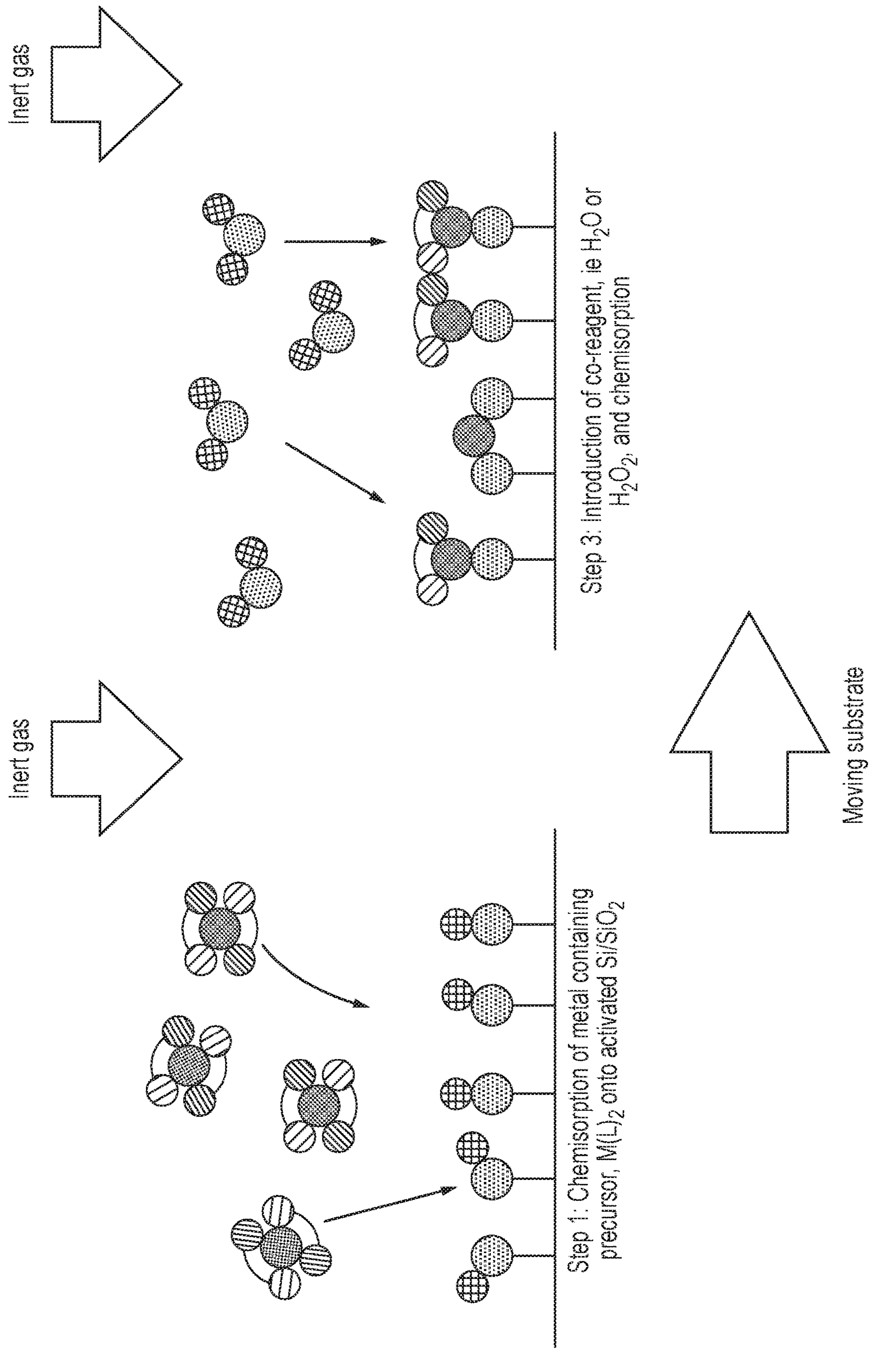
FIG. 1*b* is a schematic illustration of the spatial atomic layer deposition (ALD) process.

Synthesis of Sn (II) Alkoxide Primary Precursors

There are a number of synthetic routes for the preparation of Sn (II) alkoxides, including salt metathesis, ligand metathesis, alcohol exchange and direct reaction of tin metal with the respective alcohol.

Sn (II) alkoxide primary precursors are readily synthesized through direct amide ligand displacement reactions, as illustrated in the following scheme:

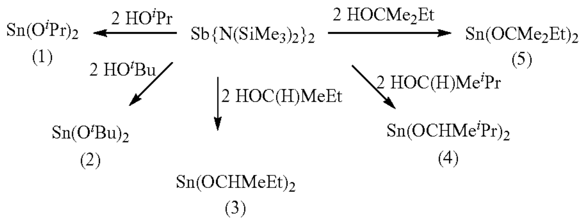

The synthesis of a number of specific examples of Sn (II) oxide primary precursors 1 to 5 suitable for use with the ALD method of the present disclosure is described in detail.

$[Sn(O^iPr)_2]_\infty$ (1)

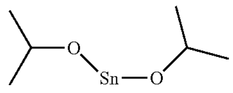

1

A stirring solution of $[Sn\{N(SiMe_3)_2\}_2]$ (0.88 g, 2 mmol) in hexane (50 mL) was cooled and added to a −78° C. solution of 2-propanol (0.24 g, 4 mmol) in hexane (20 mL) affording a colorless solution. After removal of the volatiles, the white powder was redissolved in hexane, filtered through Celite® and the volume reduced. Colorless crystals were afforded at −28° C. (0.37 g, 80%).

$^1H$ NMR (500 MHz, $C_6D_6$); 4.62 (sept, 2H, $CH(CH_3)_2$, 1.34 (d, 12H, $CH_3$). $^{13}C\{^1H\}$ NMR (75.5 MHz, $C_6D_6$); 65.6 (2C, $CH(CH_3)_2$), 28.2 (4C, $CH(CH_3)_2$). $^{119}Sn$ NMR (111.8 MHz, $C_6D_6$); −211

$[Sn(O^tBu)_2]_2$ (2)

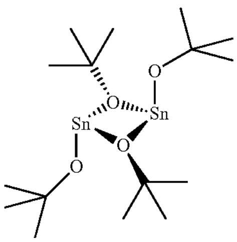

2

A stirring solution of $[Sn\{N(SiMe_3)_2\}_2]$ (0.88 g, 2 mmol) in hexane (50 mL) was cooled and added to a −78° C. solution of tert-butanol (0.30 g, 4 mmol) in hexane (20 mL) affording a colorless solution. After removal of the volatiles, the white powder was redissolved in hexane, filtered through Celite® and the volume reduced. Colorless crystals were afforded at −28° C. (0.48 g, 91%).

$^1H$ NMR (500 MHz, $C_6D_6$); 1.45 (s, 18H, $CH_3$). $^{13}C\{^1H\}$ NMR (75.5 MHz, $C_6D_6$); 72.8 (2C, $C(CH_3)_3$), 32.4 (6C, $C(CH_3)_2$). $^{119}Sn$ NMR (111.8 MHz, $C_6D_6$); −91

$[Sn(O^sBu)_2]$ (3)

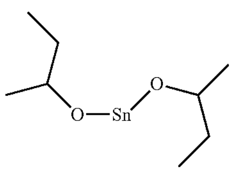

3

A stirring solution of $[Sn\{N(SiMe_3)_2\}_2]$ (0.88 g, 2 mmol) in hexane (50 mL) was cooled and added to a −78° C. solution of sec-butanol (0.30 g, 4 mmol) in hexane (20 mL) affording a colorless solution. After removal of the volatiles, the viscous clear liquid was redissolved in hexane, filtered through Celite® and the solvent removed. Distillation at 150° C. into liquid $N_2$ ($10^{-2}$ mbar) afforded a colorless liquid. (0.37 g, 70%)

$^1H$ NMR (500 MHz, $C_6D_6$); 4.26-4.33 (m, 2H, $CH(CH_3)$), 1.70-1.80 (br m, 2H, $CH_2$), 1.50-1.60 (br m, 2H, $CH_2$), 1.36 (d, J=6.2 Hz, 6H, $OCH(CH_3)$), 0.98, (t, 7.6 Hz, 6H, $CH_2CH_3$). $^{13}C\{^1H\}$ NMR (75.5 MHz, $C_6D_6$); 71.4 (2C, $CH(CH_3)$), 35.1 (2C, $CH_2$), 26.1 ($OCH(CH_3)$), 11.0 (2C, $CH_2CH_3$). $^{119}Sn$ NMR (111.8 MHz, $C_6D_6$); −141

$[Sn\{OCH(CH_3)CH(CH_3)_2\}_2]$ (4)

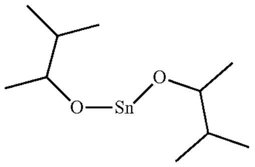

4

A stirring solution of $[Sn\{N(SiMe_3)_2\}_2]$ (0.88 g, 2 mmol) in hexane (50 mL) was cooled and added to a −78° C. solution of 3-methyl-2-butanol (0.35 g, 4 mmol) in hexane (20 mL) affording a colorless solution. After removal of the volatiles, the viscous clear liquid was redissolved in hexane, filtered through Celite® and the solvent removed. Distillation at 170° C. into liquid $N_2$ ($10^{-2}$ mbar) afforded a viscous colorless liquid. (0.38 g, 64%)

$^1H$ NMR (500 MHz, $C_6D_6$); 4.0-4.08 (m, 2H, $OCH(CH_3)$), 1.66-1.76 (m, 2H, $CH(CH_3)_2$), 1.29 (d, J=5.6 Hz, 6H, $OCH(CH_3)$), 1.03 (d, J=6.2 Hz, 6H, $CH(CH_3)$), 0.98 (d, J=6.2 Hz, 6H, $CH(CH_3)$).

$^{13}C\{^1H\}$ NMR (75.5 MHz, $C_6D_6$); 74.1 (2C, OCH), 36.8 (2C, $OCH(CH_3)$), 22.6 (2C, $CH(CH_3)_2$), 18.8 (2C, $CH(CH_3)_2$), 18.0 (2C, $CH(CH_3)_2$). $^{119}S_n$ NMR (111.8 MHz, $C_6D_6$); −154

$[Sn\{OC(CH_3)_2CH_2CH_3\}_2]$ (5)

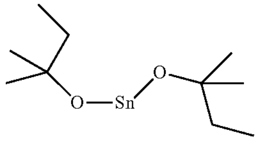

5

A stirring solution of $[Sn\{N(SiMe_3)_2\}_2]$ (0.88 g, 2 mmol) in hexane (50 mL) was cooled and added to a −78° C. solution of 2-methyl-2-butanol (0.35 g, 4 mmol) in hexane (20 mL) affording a colorless solution. After removal of the volatiles, the viscous clear liquid was redissolved in hexane, filtered through Celite® and the solvent removed. Distillation at 120° C. into liquid $N_2$ ($10^{-2}$ mbar) afforded a colorless liquid. (0.39 g, 67%)

$^1H$ NMR (500 MHz, $C_6D_6$); 1.71 (q, J=7.5 Hz, 4H, $CH_2$), 1.41 (s, 12H, $C(CH_3)_2$), 1.05 (t, J=7.5 Hz, 6H, $CH_2CH_3$). $^{13}C\{^1H\}$ NMR (75.5 MHz, $C_6D_6$); 39.7 (2C, $CH_2$), 32.0 (br, 4C, $C(CH_3)_2$), 9.74 (2C, $CH_2CH_3$)

$^{119}Sn$ NMR (111.8 MHz, $C_6D_6$); −98

EXAMPLE 2

Mass Loss-Temperature Thermogravimetric Analysis

Figure 2:
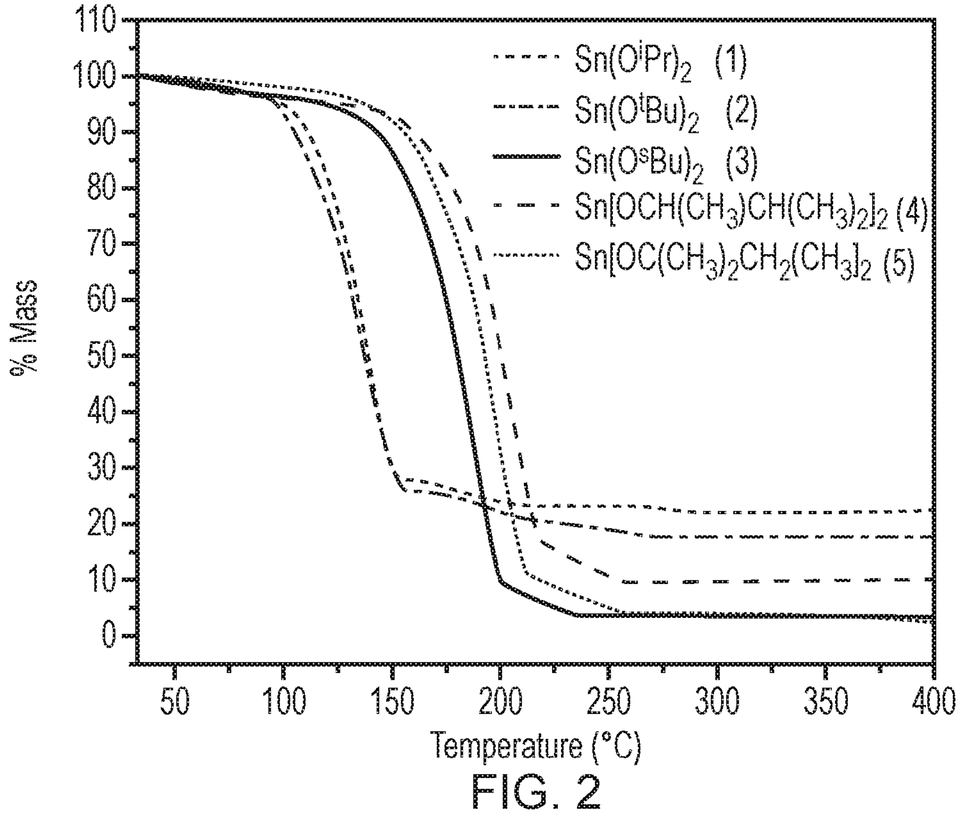
FIG. 2 is a graph of thermogravimetric analysis of Sn (II) oxide precursors used in the method of the present disclosure.

The mass loss/temperature plots for Sn (II) oxide primary precursors 1-5 is shown in FIG. 2. It is shown that each of the exemplified Sn (II) oxide primary precursors displays a loss of mass greater than would be expected for the decomposition to any of metallic tin, tin(II) oxide or tin(IV) oxide (see also Table 1).

It has been found that the degree of volatility appears to be higher in the isopropoxide and tert-butoxide systems 1 and 2 than is evident for the remainder of the series.

All of the exemplified Sn (II) oxide primary precursors display similar thermogravimetric analysis (TGA) traces, with a sharp loss of mass to ca. 90-95% of the entire mass loss, after which a second smaller loss of mass occurs. All of the exemplified Sn (II) oxide primary precursors 1 to 5 display suitable stabilities and volatilities for ALD applications.

TABLE 1

| | | Expected Residual Mass (%) | | |
|---|---|---|---|---|
| Compound | Residual Mass (%) | SnO | $SnO_2$ | Sn |
| 1 | 22.5 | 56.9 | 63.6 | 50.1 |
| 2 | 17.1 | 50.8 | 56.9 | 44.8 |
| 3 | 3.7 | 50.8 | 56.9 | 44.8 |
| 4 | 9.8 | 46.0 | 51.4 | 40.5 |
| 5 | 2.6 | 46.0 | 51.4 | 40.5 |

EXAMPLE 3

Isothermal Thermogravimetric Analysis

Figure 3:
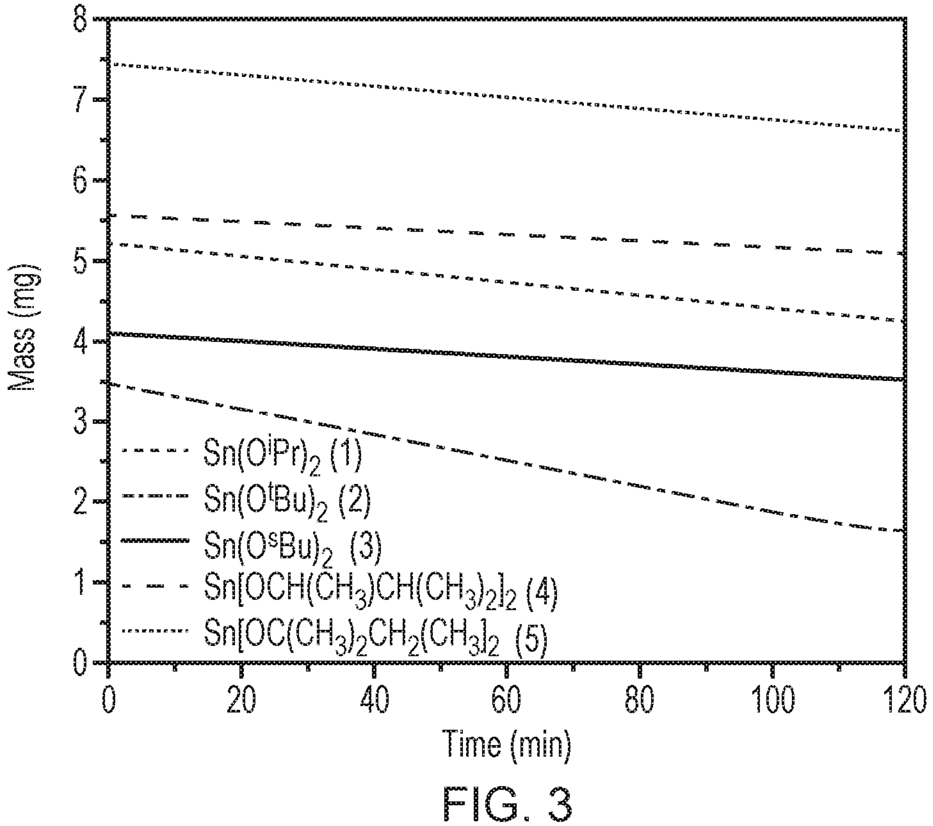
FIG. 3 is a graph of isothermogravimetric analysis of Sn (II) oxide precursors used in the method of the present disclosure.

Due to the higher observed volatilities of $[Sn(O^iPr)_2]$ (1) and $[Sn(O^tBu)_2]$ (2) as discussed in Example 2, isothermal analyses were undertaken at temperatures of 70° C., a temperature representative of a heated precursor source. For the remaining three complexes, 3, 4, and 5, isothermal experiments were undertaken at temperatures of 100° C., again representative of elevated temperature precursor sources. The results are shown in FIG. 3 and Table 2.

As is evident from the isothermal plots (FIG. 3) and evaporation rates (Table 2) for the exemplified Sn (II) oxide primary precursors, despite a lower “source” temperature, $[Sn(O^iPr)_2]$ (1) and $[Sn(O^tBu)_2]$ (2) displayed the highest volatility, the latter by a large margin. With an evaporation rate of 128.4 μg $min^{-1}$ $cm^{-1}$, $[Sn(O^tBu)_2]$ 2 exhibits almost twice as much volatility as $[Sn(O^iPr)_2]$ (65.0 μg $min^{-1}$ $cm^{-1}$). After a change in temperature to 100° C., the three exemplified Sn (II) oxide primary precursors display decreasing evaporation rates in the order $[Sn\{OC(CH_3)_2CH_2CH_3\}_2]$ (5)>$[Sn(O^sBu)_2]$ (3)>$[Sn\{OCH(CH_3)CH(CH_3)_2\}_2]$ (4), with evaporation rates of 60.8, 40.4 and 32.4 µg $min^{-1}$ $cm^{-1}$ respectively.

TABLE 2

| Compound | Evaporation rate (µg $min^{-1}cm^{-2}$) |
|---|---|
| 1 | 65.0 |
| 2 | 128.4 |
| 3 | 40.4* |
| 4 | 32.4* |
| 5 | 60.8* |

*Isothermal carried out at 100° C.

EXAMPLE 4

Deposition With Sn (II) Oxide Primary Precursors

Deposition With $[Sn(O^tBu)_2]_2$

Existing methods for the deposition of SnO via ALD involved the use of $Sn(dmamp)_2$ as the first precursor with $H_2O$ as the secondary precursor such as methods disclosed in Han et al, "Growth of p-Type Tin (II) Monoxide Thin Films by Atomic Layer Deposition from Bis (1-dimethyl amino-2-methyl-2-propoxy)tin and $H_2O$, Chem. Mater., 2014, 26, 6088-6091.

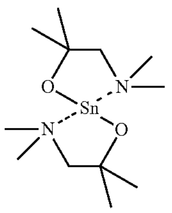

$Sn(dmamp)_2$

The resultant film layer (using $Sn(dmamp)_2$) was found to exhibit crystallinity when the operating temperature was between 150-210° C., with decreasing growth per cycle (GPC) with increasing temperature. Growth rates of ca. 0.18 Å/cycle at 170° C. and 0.05 Å/cycle at 210° C. have been reported. It has been found that films deposited at 210° C. display optimum properties of SnO and subsequent device performance. However, due to slow deposition rates, $Sn(dmamp)_2$ is commercially unattractive, particularly at 210° C.

Figure 4:
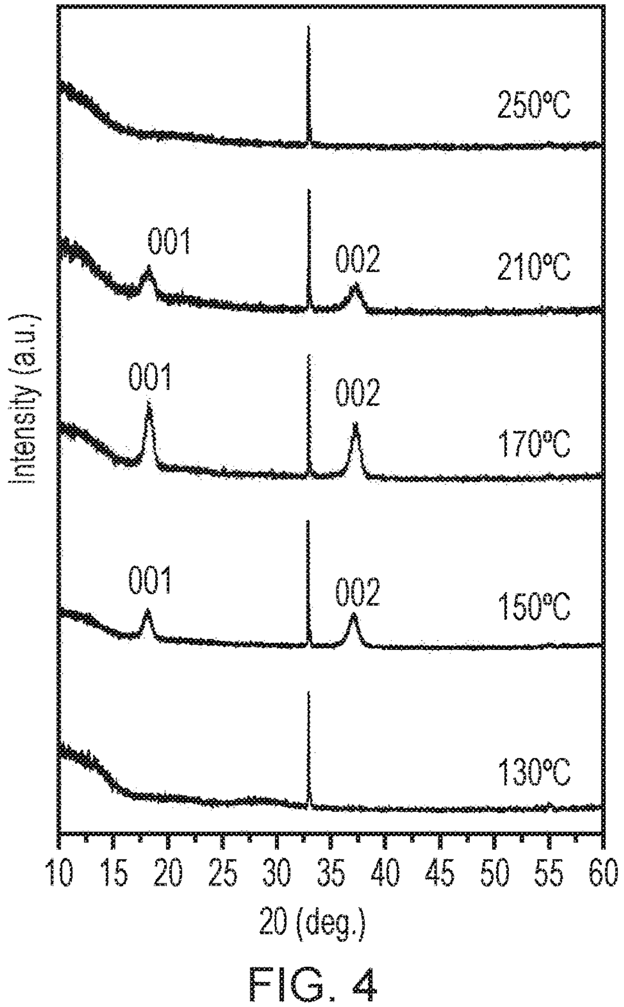
FIG. 4 is a graph of X-ray diffraction patterns of deposited film layer using $Sn(O^tBu)_2$ precursors at temperatures between 130° C. and 250° C. in the method of the present disclosure.
Figure 5:
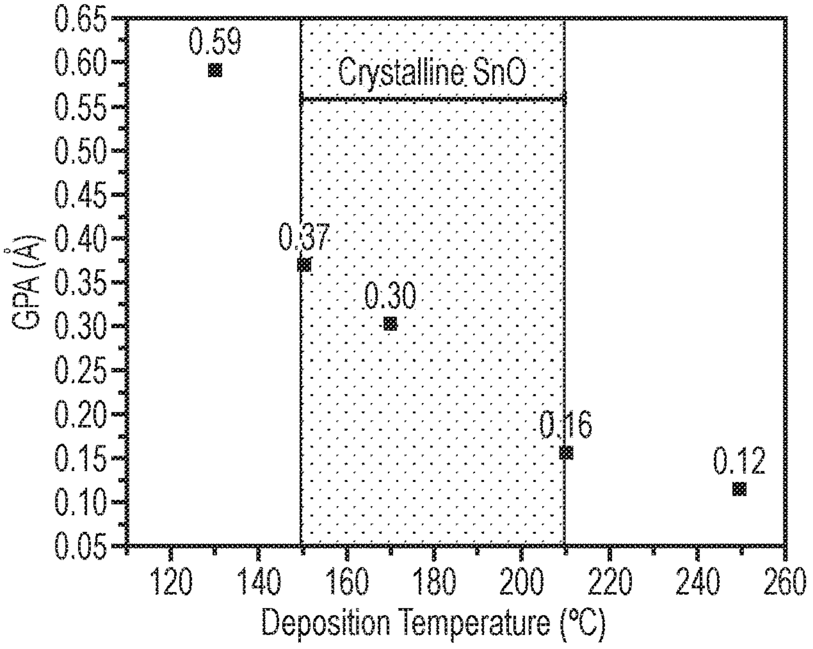
FIG. 5 is a graph illustrating the relationship between the growth per cycle of the deposited film and deposition temperature of $Sn(O^tBu)_2$ on a substrate.
Figure 6A:
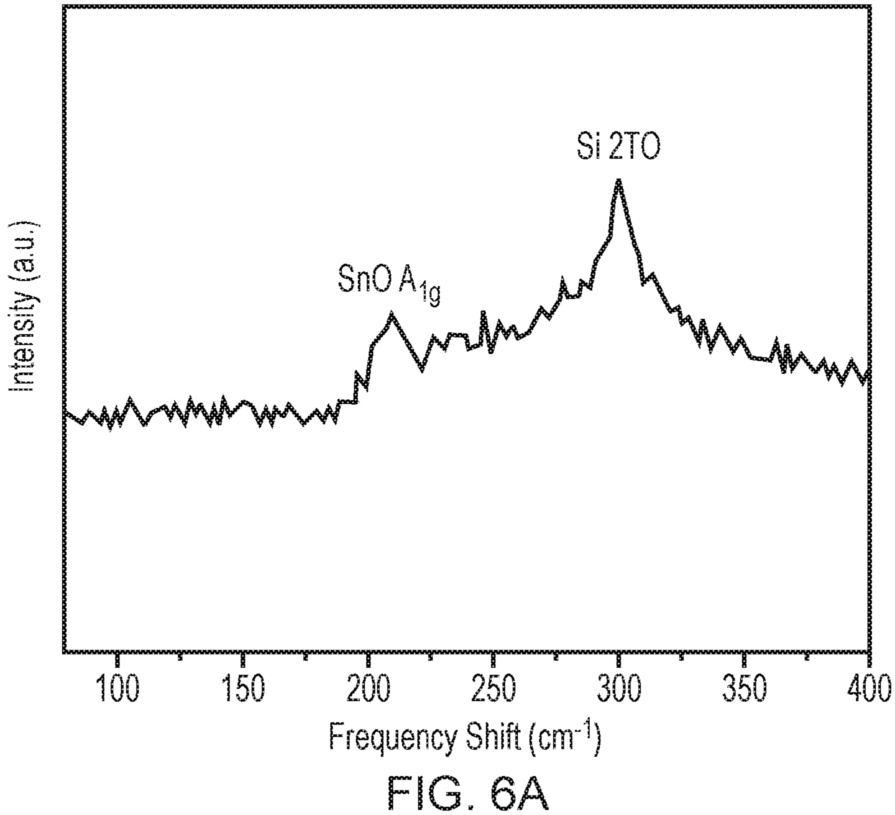
FIGS. 6*a* and 6*b* are graph of Raman spectra of SnO films deposited using $Sn(O^tBu)_2$ at temperatures of 170° C.
Figure 6B:
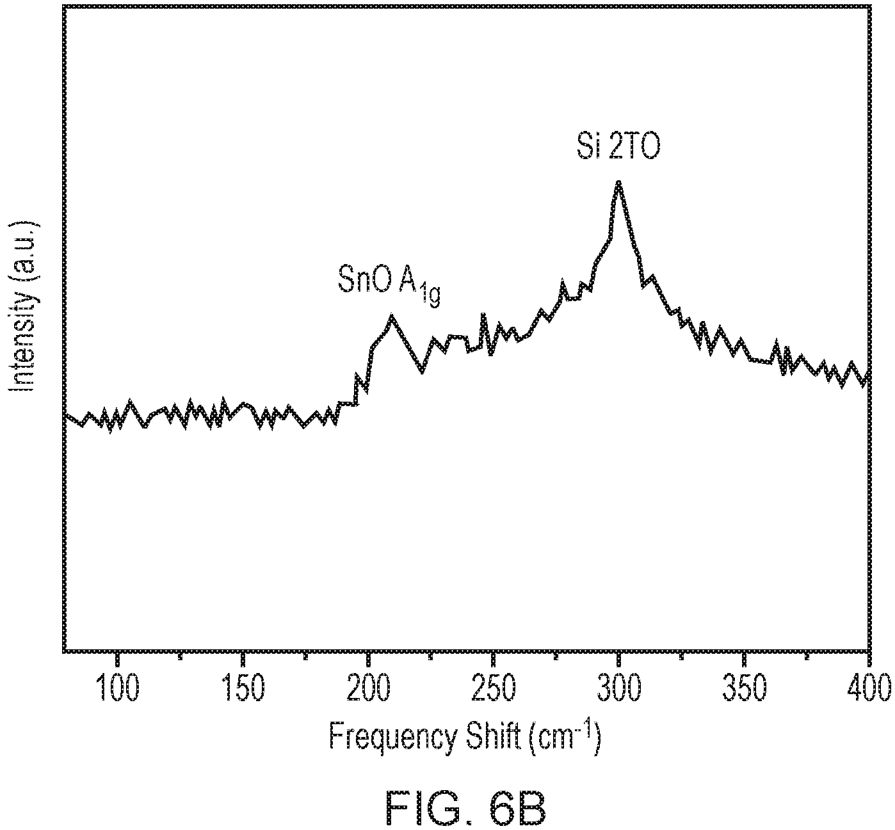

ALD experiments using $[Sn(O^tBu)_2]_2$ as the primary precursor were undertaken at a number of different operating temperatures (130° C., 150° C., 170° C., 210° C. and 250° C.) of the processing chamber. The results are shown in FIG. 4. The results showed that successful deposition of SnO was achieved.

The resultant deposited films were characterized by p-XRD, Raman spectroscopy and variable-angle spectroscopic ellipsometry. The results are shown in FIGS. 4, 5, 6*a* and 6*b*.

The thickness of each deposited film was determined by variable-angle spectroscopic ellipsometry and was found to decrease with increasing temperature of the processing chamber with values of 25.19 (130° C.), 15.78 (150° C.), 12.95 (170° C.), 6.75 (210° C.) and 5.01 nm (250° C.) respectively.

Powder X-ray diffraction patterns of the SnO films deposited at temperatures between 130° C. and 250° C. (FIG. 4) confirm that crystalline SnO was deposited at temperatures between 150° C. and 210° C. (150° C., 170° C. and 210° C.).

All of the crystalline SnO films deposited were found to display highly oriented SnO, with the (001) and (002) reflections present at 2θ values of ~18.3° and ~37.1° (see FIG. 4). Basic analysis of the peak broadening within the patterns indicate rough estimates of ca. 7.5 (150° C.), 8.0 (170° C.) and 5.8 nm (210° C.) for the mean crystallite dimensions along the C-axes at each temperature. The crystallites were found to reach a maximum value of ca. 8 nm. The thicknesses of all deposited films were shown to be consistently higher than those reported by Han et al. for the published precursor $[Sn(dmamp)_2]$.

Raman spectroscopy (FIGS. 6*a* and 6*b*) was also undertaken on crystalline films grown from $[Sn(O^tBu)_2]$ primary precursors (after 425 cycles of ALD) at temperatures of 170° C. and 210° C. and confirms the presence of SnO deposited film and a lack of $SnO_2$. The presence of the SnO $A_{1g}$ stretch can clearly be observed at 210 $cm^{-1}$, consistent with SnO films previously characterized.

Figure 7:
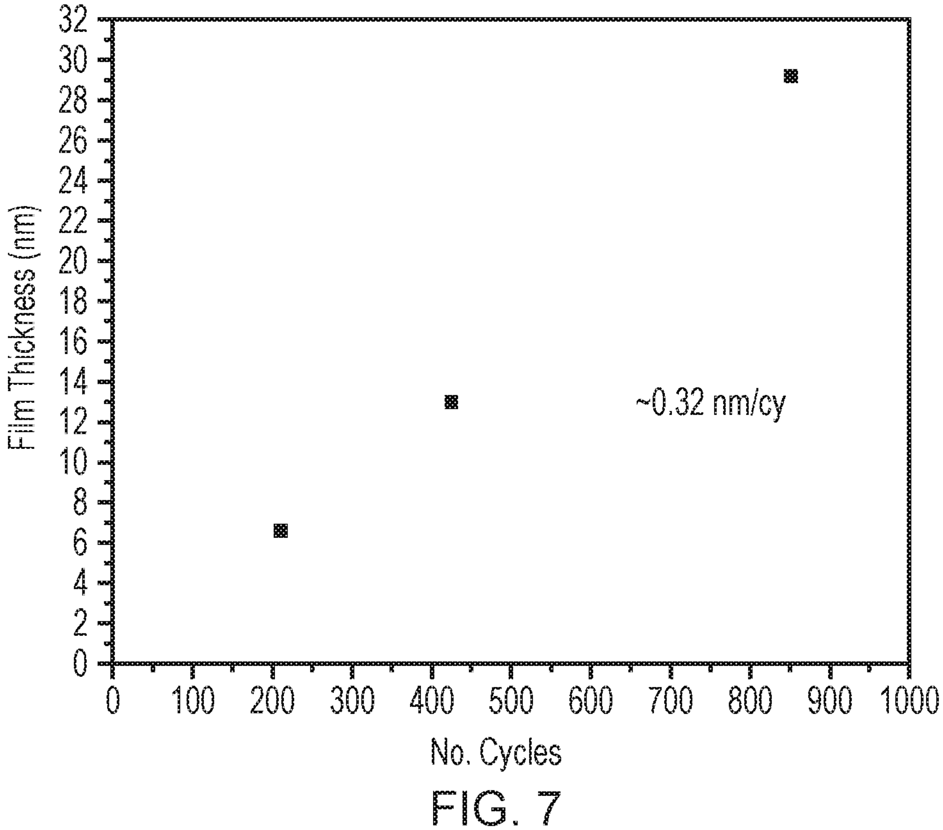
FIG. 7 is a graph illustrating the relationship between the thickness of deposited film using $Sn(O^tBu)_2$ at a temperature of 170° C. and the number of cycles of ALD.

A study to determine an accurate growth rate and extent of ALD behavior was undertaken at 170° C. (FIG. 7). Growth was found to follow a largely linear trajectory consistent with a self-limiting ALD process. The growth per cycle was confirmed to considerably exceed that observed for $Sn(dmamp)_2$ at the same deposition temperature, using the same deposition parameters. Growth rates using $Sn(dmamp)_2$ as the primary precursor in ALD deposition were reported to be between ca. 0.16 Å/cy at 170° C., and increased to 0.18 Å/cy through optimization. In contrast, it has been found that the growth rate at the same temperature using $Sn(O^tBu)_2$ was found to occur at a rate of 0.32 Å. As such, the growth rates for SnO deposition using the Sn (II) oxide primary precursors of the method of the present disclosure were found to be significantly higher that the growth rates for deposited films formed from $[Sn(dmamp)_2]$ precursors at each respective temperature (see FIG. 5). It therefore appears that the film layers formed using the Sn (II) containing precursors of the present disclosure are more commercially attractive than known Sn (II) containing precursors, such as $Sn(dmamp)_2$.

Comparative Example

ALD Without an $H_2O$ Pulse

A standard ALD process using $Sn(O^tBu)_2$ as a primary precursor was undertaken at 170° C. without the presence of an $H_2O$ pulse. It was found that no deposition was observed on the substrate, and spectroscopic ellipsometry confirmed only a marginal <1 nm change to the surface of the $SiO_2$, which is most likely due to a monolayer of adsorbed precursor affecting the refractive index of the substrate. This study proves that no CVD-style deposition is occurring, and the process is an ALD process.

Depositions with $[Sn\{OC(CH_3)_2CH_2CH_3\}_2]$ (5)

Figure 8:
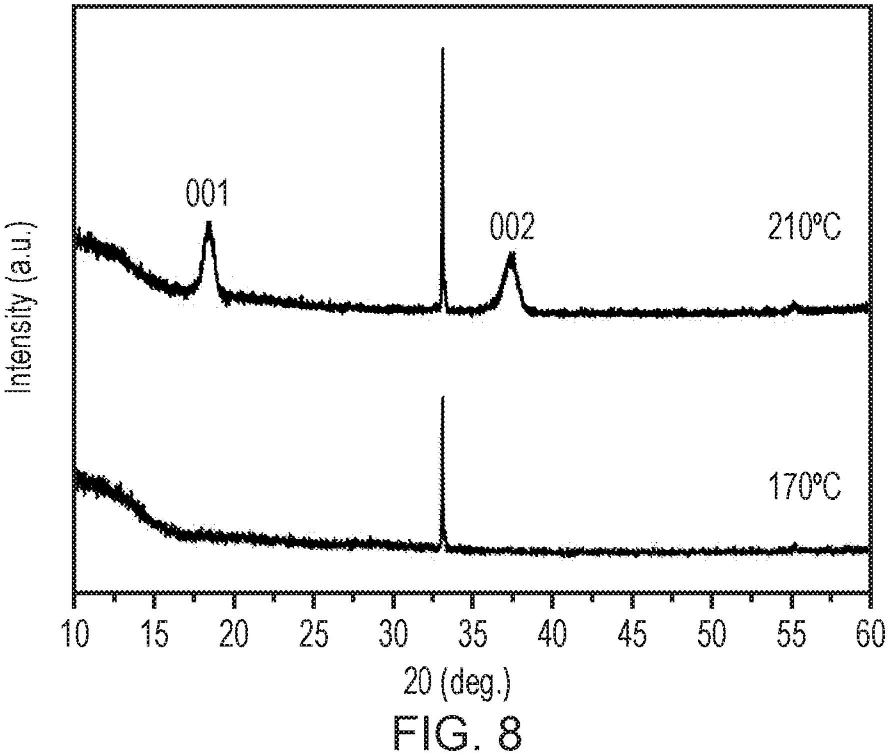
FIG. 8 is a graph of X-ray diffraction patterns of films deposited using $Sn(OC(CH_3)_2CH_2CH_3)_2$ precursors at temperatures of 170° C. and 210° C. in the method of the present disclosure.

ALD deposition was carried out at reactor temperatures of 170° C. and 210° C. and successful deposition occurred at both temperatures. Films deposited at the higher temperature of 210° C. were found to display crystallinity (FIG. 8).

Highly oriented material was observed, with the p-XRD pattern clearly displaying peaks consistent with the (001) and (002) planes of SnO. The amorphous films were determined to have a thickness of 20.7 nm after 425 ALD cycles, giving an estimated growth per cycle of 0.49 Å, whilst the crystalline films determined to consist of SnO by p-XRD were shown to have a thickness of 11.3 nm, with a growth rate of 0.27 Å/cy. Estimations of crystallite dimensions in the C-axis for the crystalline film were found to be ca. 7.7 nm, consistent with results outlined previously. Direct comparison of deposition between the published standard Sn(dmamp)2 and novel precursor $Sn\{OC(CH_3)_2CH_2CH_3\}_2$ at 210° C. shows a significant increase in growth rate from 0.05 Å/cy with the published precursor to 0.27 Å/cy with $Sn\{OC(CH_3)_2CH_2CH_3\}_2$. This is of particular relevance as films deposited at 210° C. have been shown to display excellent electrical properties for use as p-type channel layers in thin-film transistors.

EXAMPLE 5

$Ge(O^tBu)_2$

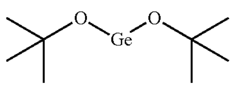

Preparation: A stirring solution of $[Ge\{N(SiMe_3)_2\}_2]$ (0.39 g, 1 mmol) in hexane (50 mL) was cooled and added to a −78° C. solution of tert-butanol (0.2 mL, 2 mmol) in hexane (20 mL) affording a colorless solution. After removal of the volatiles, the white powder was redissolved in hexane, filtered through Celite® and the volume reduced. Colorless crystals were afforded at −28° C.

$^1H$ NMR (500 MHz, $C_6D_6$); 1.48 ppm (s, 18H, $CH_3$). $^{13}C\{^1H\}$ NMR (75.5 MHz, $C_6D_6$); 34.3, 32.4 (6C, $C(CH_3)_2$).

$Ge(O^tBu)_2$ may be used as a precursor in ALD as discussed herein and as set out in the Examples above. Mass loss as determined by thermogravimetric analysis is almost complete by 150° C.

The disclosures of the published documents referred to herein are incorporated by reference in their entirety.

This application claims the priority of GB1913951.8 and the entire content of the priority application is incorporated by reference in this international application.

The invention claimed is:

1. An atomic layer deposition (ALD) method of a metal (M) containing film layer on a substrate, the method comprising:

forming a chemisorbed, surface-bound metal-ligand species using a metal (M) (II) primary precursor of formula (I):

$$M(OCR^1R^2R^3)\ L \quad (I)$$

wherein:

M is Sn (II), such that the metal (M) containing film layer is an M (II) containing film layer;

L is a ligand displaying ALD reactivity for a secondary precursor;

$R^1$, $R^2$, and $R^3$ are each independently selected from: H or a linear or branched alkyl groups, and wherein at least one of $R^1$, $R^2$ and $R^3$ is a linear or branched alkyl group.

2. The atomic layer deposition method as claimed in claim 1, in which the Sn (II) containing film layer is an Sn (II) oxide film layer.

3. The atomic layer deposition method as claimed in claim 2, in which the Sn (II) oxide film layer is a crystalline Sn (II) oxide containing film layer.

4. The atomic layer deposition method as claimed in claim 1, in which the metal (M) containing film layer is a multi-component metal (M) containing film layer comprising at least one additional metal (M').

5. The atomic layer deposition method as claimed in claim 4, in which the at least one additional metal (M') is selected from one or more of: Ti, In, Ga, Zn, Cu, Sr, Ba, Mg, W, Pb, Se, S, Te, Bi, Fe, Ni, Co, Al, Si, Sb, K, Na, Ca, Sr, Ba, Li, V and La, or any combination thereof.

6. The atomic layer deposition method as claimed in claim 1, in the atomic layer deposition (ALD) of a metal (M) and F containing film layer.

7. The atomic layer deposition method as claimed in claim 1, in which L is an amide, alkoxide, aminoalcohol, aminoamide, alkoxyether, cyclopenadienyl (Cp), or Cp derivative, or halide.

8. The atomic layer deposition method as claimed in claim 7, in which L is an amide ligand or an alkoxide ligand.

9. The atomic layer deposition method as claimed in claim 8, in which L is an alkoxide ligand of formula $(OCR^{1'}R^{2'}R^{3'})$, wherein $R^{1'}$, $R^{2'}$, and $R^{3'}$ are each independently selected from: H or a linear or a branched alkyl group, and wherein at least one of $R^{1'}$, $R^{2'}$ and $R^{3'}$ is a linear or branched alkyl group.

10. The atomic layer deposition method as claimed in claim 9, in which L is an alkoxide ligand of formula $(OCR^{1'}R^{2'}R^{3'})$, in which $(OCR^{1'}R^{2'}R^{3'})$ is the same as $(OCR^1R^2R^3)$ group of the metal (M) (II) containing primary precursor of formula (I).

11. An atomic layer deposition (ALD) method for forming a film layer of a metal (M) containing film layer on a surface of a substrate, the method comprising:

heating a substrate in a processing chamber;

introducing an M (II) primary precursor of formula (I):

$$M(OCR^1R^2R^3)\ L \quad (I)$$

wherein:

M is Sn (II);

L is a ligand displaying ALD reactivity for a secondary precursor;

$R^1$, $R^2$, and $R^3$ are each independently selected from: H or a linear or branched alkyl groups, and wherein at least one of $R^1$, $R^2$ and $R^3$ is a linear or branched alkyl group, to the processing chamber in a first dose stage for a predetermined first dose time;

subsequently purging the processing chamber in a first purge stage to remove remaining M (II) primary precursor;

introducing a secondary precursor to the processing chamber in a second dose stage for a predetermined second dose time; and subsequently purging the processing chamber in a second purge stage to remove the secondary precursor; optionally repeating one or more of: the first dose stage, first purge stage, second dose stage and second purge stage;

to produce an M (II) containing film layer on the surface of the substrate.

12. The atomic layer deposition method as claimed in claim 11, in which $R^1$, $R^2$, and $R^3$ are each independently selected from: H or linear or branched $C_{1-4}$ alkyl groups, and wherein at least one of $R^1$, $R^2$ and $R^3$ is a linear or branched $C_{1-4}$ alkyl group.

13. The atomic layer deposition method as claimed in claim 12, in which the film layer is a crystallized film layer.

14. The atomic layer deposition method as claimed in claim 12, in which the M (II) primary precursor is selected from: $Sn(O^iPr)_2$, $Sn(O^tBu)_2$, $Sn(OC(H)MeEt)_2$, $Sn(OC(H)Me^iPr)_2$, and $Sn(OCMe_2Et)_2$.

15. The atomic layer deposition method as claimed in claim 14, in which the M (II) primary precursor is selected from: $Sn(O^tBu)_2$, $Sn(OC(H)MeEt)_2$ and $Sn(OCMe_2Et)_2$.

16. The atomic layer deposition method as claimed in claim 11, in which the processing chamber is heated to a temperature within a range of between 70° C. and 250° C.

17. The atomic layer deposition method as claimed in claim 16, in which the processing chamber is heated to a temperature within a range of between 130° C. and 210° C.

18. An atomic layer deposition (ALD) method for forming a film layer of a metal (M) containing film layer on a surface of a substrate, the method comprising:

heating a substrate in a processing chamber;

contacting a surface of the substrate with an M (II) primary precursor of formula (I):

$$M(OCR^1R^2R^3)\ L \quad (I)$$

wherein:

M is Sn (II);

L is a ligand displaying ALD reactivity for a secondary precursor;

$R^1$, $R^2$, and $R^3$ are each independently selected from: H or a linear or branched alkyl groups, and wherein at least one of $R^1$, $R^2$ and $R^3$ is a linear or branched alkyl group, in the processing chamber in a first dose stage for a predetermined first dose time;

either optionally purging the processing chamber in a first optional purge stage to remove remaining M (II) primary precursor, or optionally moving the substrate relative to a precursor source in a first optional movement stage;

contacting the surface of the substrate with a secondary precursor in a second dose stage for a predetermined second dose time; and either optionally subsequently purging the processing chamber in a second optional purge stage to remove the secondary precursor, or optionally moving the substrate relative to a secondary precursor source in a second optional movement stage;

optionally repeating one or more of: the first dose stage, first optional purge stage, first optional movement stage, second dose stage and second optional purge stage, and second optional movement stage;

to produce an M (II) containing film layer on the surface of the substrate.

19. An atomic layer deposition (ALD) method for forming a film layer of a metal (M) containing film layer on a surface of a substrate, the method comprising:

heating a substrate in a processing chamber;

introducing an M (II) primary precursor of formula (I) to the processing chamber in a first dose stage for a predetermined first dose time:

$$M(OCR^1R^2R^3)\ L \quad (I)$$

wherein:

M is Sn (II);

L is a ligand displaying ALD reactivity for a secondary precursor;

$R^1$, $R^2$, and $R^3$ are each independently selected from: H or a linear or branched alkyl groups, and wherein at least one of $R^1$, $R^2$ and $R^3$ is a linear or branched alkyl group;

subsequently purging the processing chamber in a first purge stage to remove remaining M (II) primary precursor;

introducing a secondary precursor to the processing chamber in a second dose stage for a predetermined second dose time; wherein the secondary precursor is selected from $H_2O$, $H_2O_2$, plasma, carboxylic acids, nitrous oxide, hydrogen, oxygen, ozone, ammonia, hydrogen sulfide, $NH_3$, $PR_3$, $H_2Se$, $E(NR_2)$, $SiR'_3$, $OP(OR)_3$, $HOP(O)(OR)_2$, $PR_3$ or $PH_3$;

wherein E is Se or Te, and

R and R' are independently selected from H, alkyl or aryl; and subsequently purging the processing chamber in a second purge stage to remove the secondary precursor;

to produce an M (II) containing film layer on the surface of the substrate.

20. The method of claim 19, further comprising repeating one or more of: the first dose stage, the first purge stage, the second dose stage, and the second purge stage.

* * * * *